United States Patent
Tu

(10) Patent No.: US 7,745,865 B2
(45) Date of Patent: Jun. 29, 2010

(54) DEVICES AND METHODS FOR PREVENTING CAPACITOR LEAKAGE

(75) Inventor: Kuo-Chi Tu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 573 days.

(21) Appl. No.: 11/184,786

(22) Filed: Jul. 20, 2005

(65) Prior Publication Data

US 2007/0018224 A1 Jan. 25, 2007

(51) Int. Cl.
*H01L 27/108* (2006.01)

(52) U.S. Cl. .................. 257/301; 257/298; 257/296; 257/306; 257/311; 257/E28.086; 257/E28.092

(58) Field of Classification Search ........... 438/240, 438/239, 243, 396; 257/296, 301, 297, E21.651, 257/E21.655, E24.647, E21.653, 303, 306, 257/71, E27.086, E27.094, E27.092, E29.346, 257/E21.396

See application file for complete search history.

(56) References Cited

U.S. PATENT DOCUMENTS

| | | | |
|---|---|---|---|
| 5,597,756 A | * | 1/1997 | Fazan et al. .............. 438/398 |
| 6,274,424 B1 | | 8/2001 | White, Jr. et al. |
| 6,294,426 B1 | | 9/2001 | Tu et al. |
| 6,391,735 B1 | * | 5/2002 | Durcan et al. .............. 438/396 |
| 6,468,858 B1 | * | 10/2002 | Lou ........................... 438/253 |
| 6,677,217 B2 | * | 1/2004 | Joo et al. ..................... 438/398 |
| 6,815,752 B2 | | 11/2004 | Kitamura |
| 2002/0142539 A1 | | 10/2002 | Tu et al. |
| 2002/0192904 A1 | | 12/2002 | Yang |
| 2003/0013252 A1 | | 1/2003 | Hwang et al. |
| 2003/0077860 A1 | | 4/2003 | Tu |
| 2004/0232462 A1 | * | 11/2004 | Takeuchi ..................... 438/253 |
| 2004/0248361 A1 | * | 12/2004 | Oh et al. ..................... 438/240 |
| 2005/0051824 A1 | * | 3/2005 | Iizuka et al. ................ 257/306 |

\* cited by examiner

*Primary Examiner*—Wai-Sing Louie
*Assistant Examiner*—Eva Y. Montalvo
(74) *Attorney, Agent, or Firm*—Birch, Stewart, Kolasch & Birch, LLP

(57) ABSTRACT

Devices and methods for preventing capacitor leakage caused by sharp tip. The formation of sharp tip is avoided by a thicker bottom electrode which fully fills a micro-trench that induces formation of the sharp tip. Alternatively, formation of the sharp tip can be avoided by recessing the contact plug to substantially eliminate the micro-trench.

4 Claims, 9 Drawing Sheets

DEVICES AND METHODS FOR PREVENTING CAPACITOR LEAKAGE

BACKGROUND

The present invention relates in general to semiconductor manufacturing. More particularly, it relates to devices and methods for preventing capacitor leakage.

As the density of DRAM (Dynamic Random Access Memory) cells increases, dimensions of DRAM devices have to be decreased. This decreased size adversely influences the ability to provide the requisite DRAM capacitance. Increasing the vertical dimensions for DRAM, cup-shaped capacitor structures have allowed desired capacitance values for DRAM devices to be achieved. The increase in these vertical dimensions is usually accomplished via formation of cup-shaped capacitor structure, located in capacitor openings. The capacitor opening must be etched through a stop layer to expose the contact plug thereunder, and over-etching is necessary to ensure the capacitor opening is fully defined in every cell areas over a semiconductor wafer. When there is an overlay shift of the capacitor opening, the over-etching, however, produces a micro-trench under the capacitor opening, adversely affecting reliability.

The micro-trench problem discussed is illustrated in related art in FIGS. 1-2. This is not presented as prior art for the purpose of determining the patentability of the invention, but merely illustrates a problem found by the inventor. Referring to FIG. 1, a conductive contact plug 20 is formed through a first insulating layer 30 over a source/drain region 12 of a MOS field effect transistor (MOSFET) 10. A capacitor opening 45 is etched through a second insulating layer 40 and a stop layer 35 to expose the underlying contact plug 20. Over-etching is performed to compensate for variations in layer thickness and etch rates. The over-etch causes undesirable attacks on the first insulating layer 30 that is exposed when the stop layer 35 is etched away, thus forming a micro-trench 45a. FIG. 2 is a partially enlarged cross-section showing a capacitor subsequently formed in the capacitor opening 45 of FIG. 1. As shown in FIG. 2, a bottom electrode 50, a capacitor dielectric 55, and a top electrode 60 are sequentially deposited within the capacitor opening 45. Due to the presence of the micro-trench 45a, an unwanted sharp tip is formed at the bottom corner of the top electrode 60. This sharp tip induces a high electric field, causes capacitor dielectric leakage, and poses reliability risks associated with circuit open, breakdown, and TDDB (time dependent dielectric breakdown) failure. It is advantageous to reduce or eliminate the formation of the sharp tip.

SUMMARY

According to a first embodiment of the invention, sharp tip formation is avoided by a thicker bottom electrode which fully fills the micro-trench.

An exemplary device according to the first embodiment comprises a contact plug; a capacitor landing on the contact plug with an overlay shift, comprising a bottom electrode on the top and sidewall of the contact plug, a capacitor dielectric on the bottom electrode, and a top electrode on the capacitor dielectric; wherein the total thickness Z of the bottom electrode and the capacitor dielectric satisfies at least one of the conditions: $Z \geq Y$ or $Z \geq \frac{1}{2}X$, where X is the distance of the overlay shift, and Y is the height of the sidewall of the contact plug covered by the bottom electrode.

An exemplary method according to the first embodiment comprises forming a contact plug in a first insulating layer; forming a second insulating layer overlying the contact plug and the first insulating layer; forming a capacitor opening in the second insulating layer down to the contact plug with an overlay shift, the capacitor opening including a trench portion below the first insulating layer, exposing at least part of the sidewall of the contact plug; and forming a capacitor in the capacitor opening, comprising forming a bottom electrode on the top and the exposed sidewall of the contact plug, forming a capacitor dielectric on the bottom electrode, and forming a top electrode on the capacitor dielectric; wherein the total thickness Z of the bottom electrode and the capacitor dielectric satisfies the at least one of the conditions: $Z \geq Y$ or $Z \geq \frac{1}{2}X$, where X is the width of the trench portion, and Y is the depth of the trench portion.

According to a second embodiment of the invention, the sharp tip formation is avoided by recessing the contact plug such that the micro-trench is eliminated.

An exemplary device according to the second embodiment comprises a contact plug having a top flange; and a capacitor landing on the contact plug with an overlay shift, comprising a bottom electrode on the contact plug, a capacitor dielectric on the bottom electrode, and a top electrode on the capacitor dielectric with the top flange of the contact plug fitting against the capacitor.

An exemplary method according to the second embodiment comprises forming a contact plug in a first insulating layer; forming a second insulating layer overlying the contact plug and the first insulating layer; forming a capacitor opening in the second insulating layer down to the contact plug with an overlay shift, the capacitor opening including a trench portion below the first insulating layer, exposing at least part of the sidewall of the contact plug; and recessing the contact plug; and forming a capacitor thereon.

BRIEF DESCRIPTION OF THE DRAWINGS

For a better understanding of the present invention, reference is made to a detailed description to be read in conjunction with the accompanying drawings, in which.

DESCRIPTION

Figure 1:
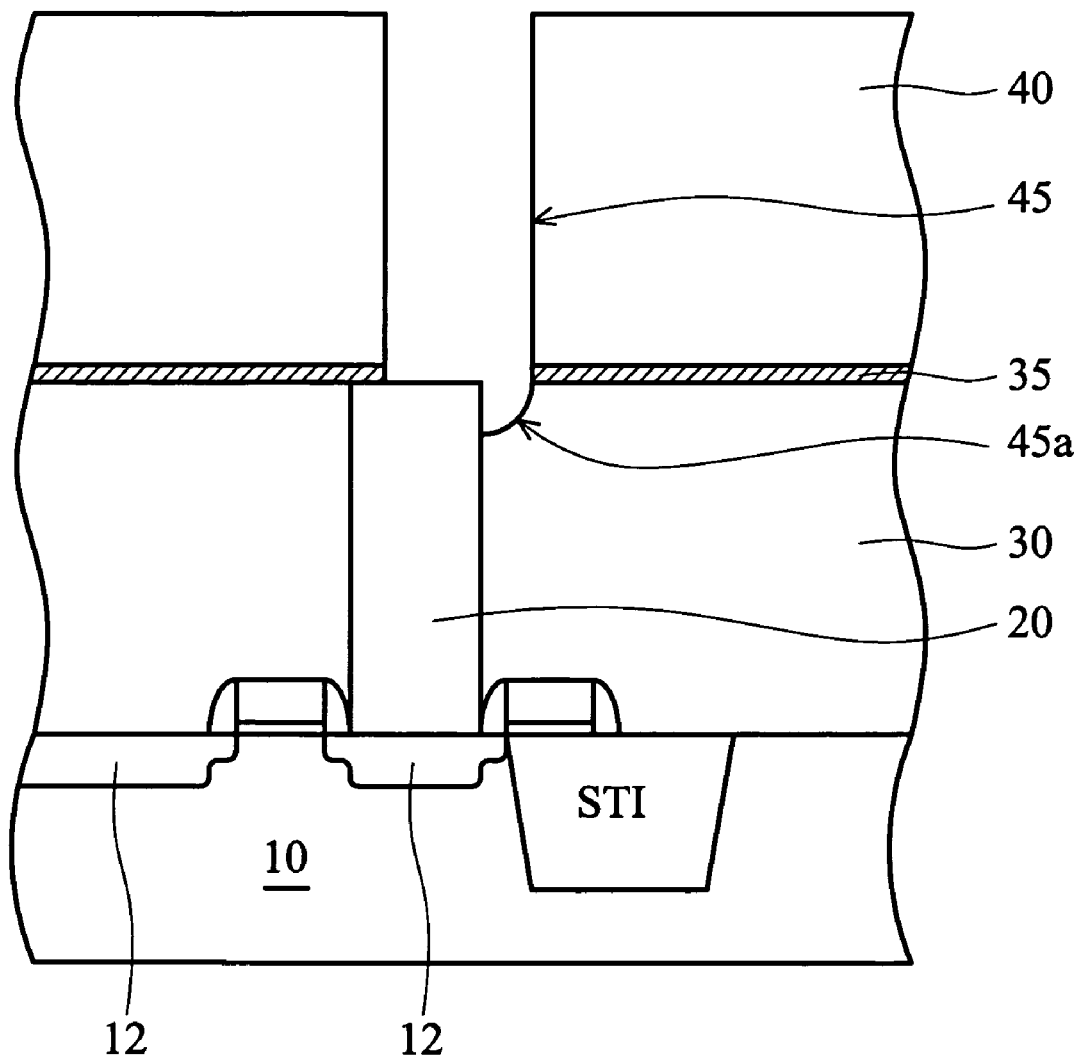
FIGS. 1 to 2 are cross-sections of a conventional method for forming a cup-shaped capacitor known to the inventor.
Figure 2:
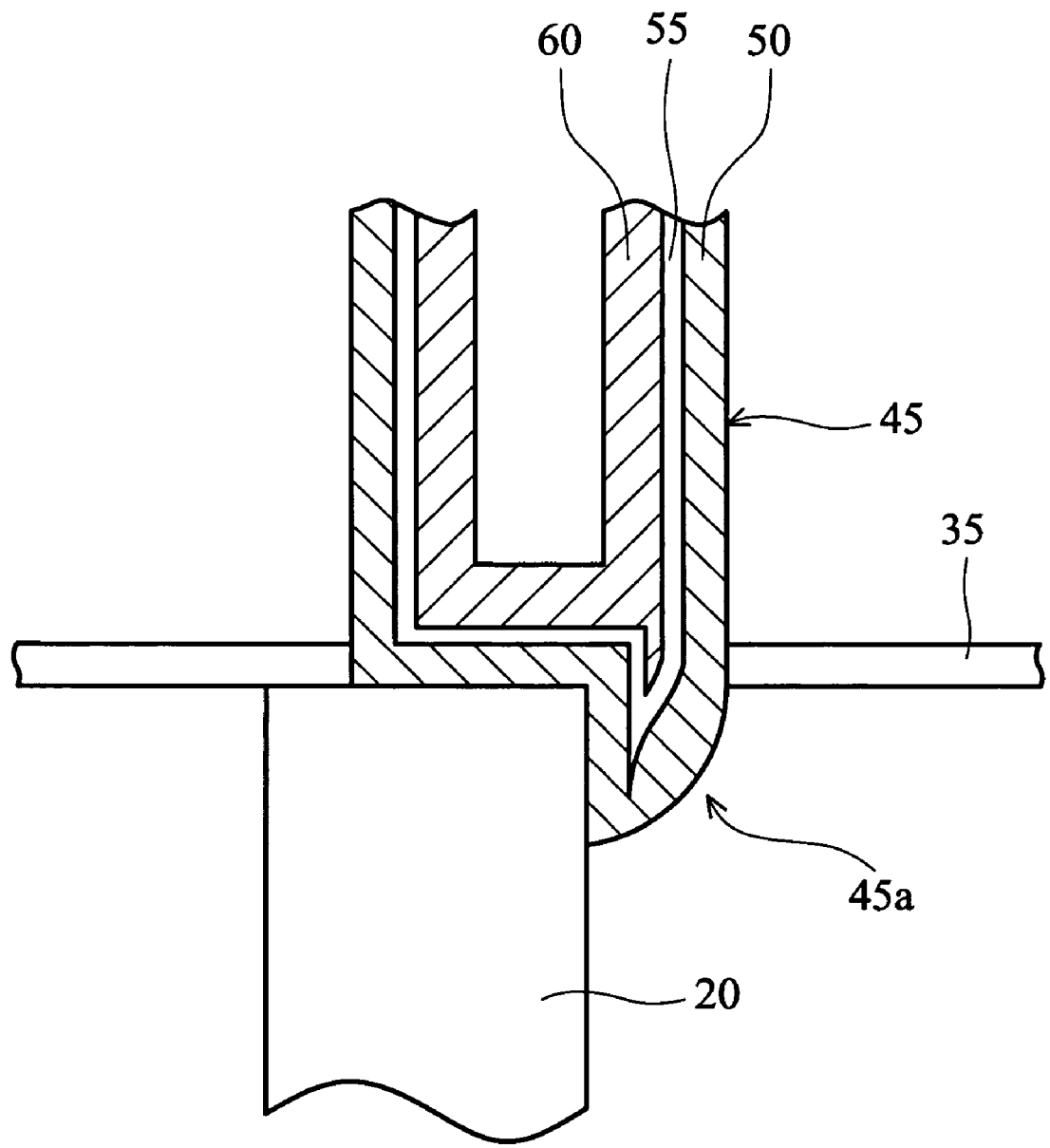
Figure 3:
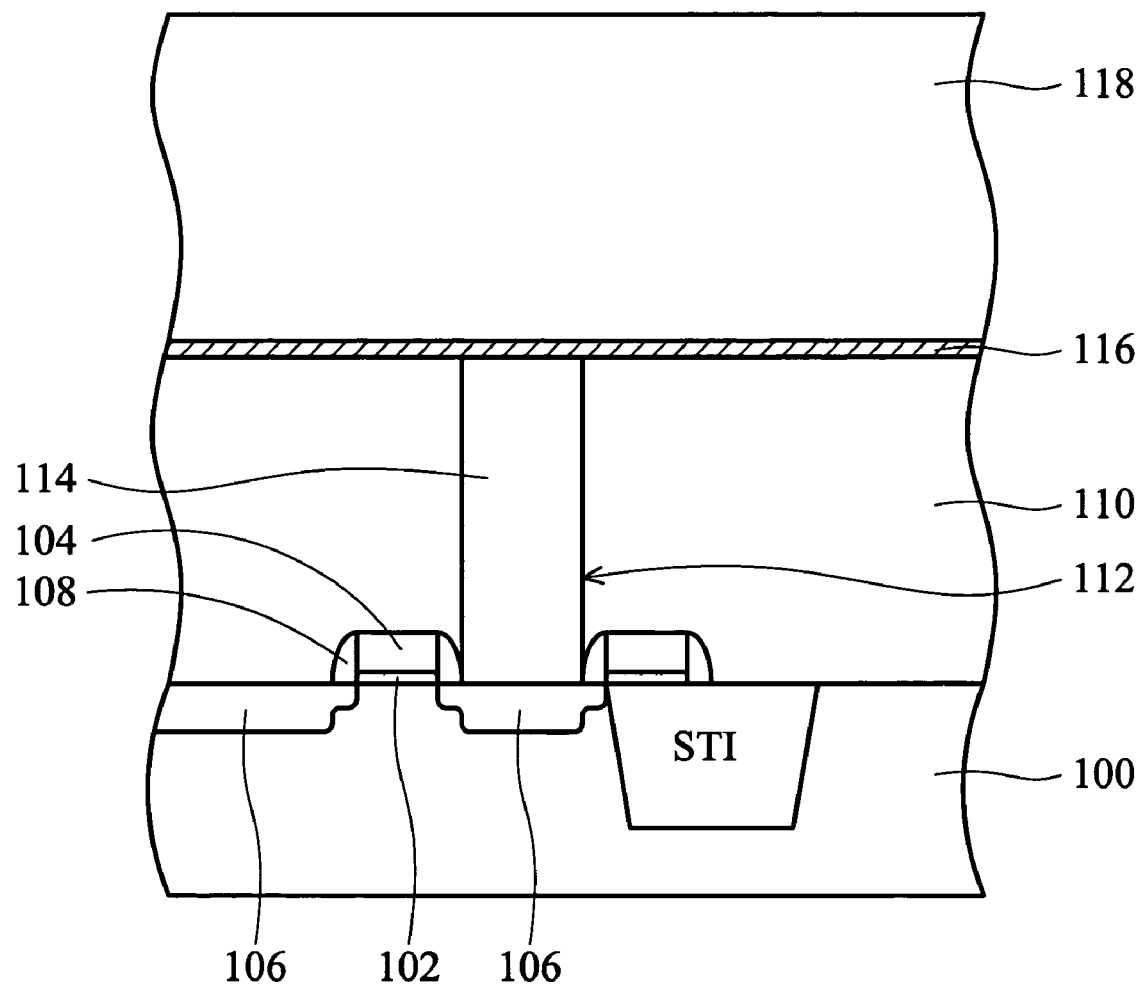
FIGS. 3 to 7 are cross-sections showing a first embodiment of the invention for preventing capacitor leakage.

Methods and devices for preventing capacitor leakage caused by the micro-trench of FIG. 2 are described here in greater detail. FIGS. 3-7 illustrate a first embodiment of the invention. FIG. 3 illustrates a partially completed DRAM cell on a semiconductor substrate 100. The partially completed DRAM cell is described briefly since it is not essential to discussion of the novel features of the invention. The substrate 100 is typically composed of single-crystal silicon having a <100> crystallographic orientation and having an array of memory cell areas surrounded and electrically isolated by shallow trench isolations (STI). The cross-section through the DRAM cell area shows two closely spaced MOSFET transistors. The MOSFET transistor may comprise a gate dielectric 102, a gate electrode 104, and source/drain regions 106. The gate electrode 104 is surrounded by insulating spacers 108 such as nitride spacers. The gate electrode 104 and source/drain regions 106 may be optionally silicided (not shown) to decrease the resistivity thereof.

Still referring to FIG. 3, a first insulating layer 110 is deposited on the substrate and is planarized over the MOSFETs. The first insulating layer is typically silicon oxide deposited by low pressure chemical vapor deposition (LPCVD) using tetraethoxysilane (TEOS) as the reactant gas. Alternatively, dopants such as boron and phosphorus can be added to layer 110 during deposition to form a borophosphosilicate glass (BPSG). The first insulating layer 110 is then planarized, for example, by chemical-mechanical polishing (CMP) to form a top planar surface over the MOSFET devices.

Continuing with the process, as shown in FIG. 3, a contact opening 112 is etched to the source/drain regions 106 for capacitor nodes. An electrically conductive material such as doped polysilicon or tungsten is deposited and polished back to form a contact plug 114 for capacitors. Next, an etch stop layer 116, preferably a silicon nitride or silicon oxynitride layer, is formed over the first insulating layer 110 and the contact plug 114. A second insulating layer 118 is then formed over the etch stop layer 116. The second insulating layer is preferably silicon oxide deposited by LPCVD using tetraethoxysilane (TEOS) as the reactant gas. The second insulating layer defines the height of the capacitor bottom electrodes and is deposited to a thickness determined by circuit design.

Figure 4:
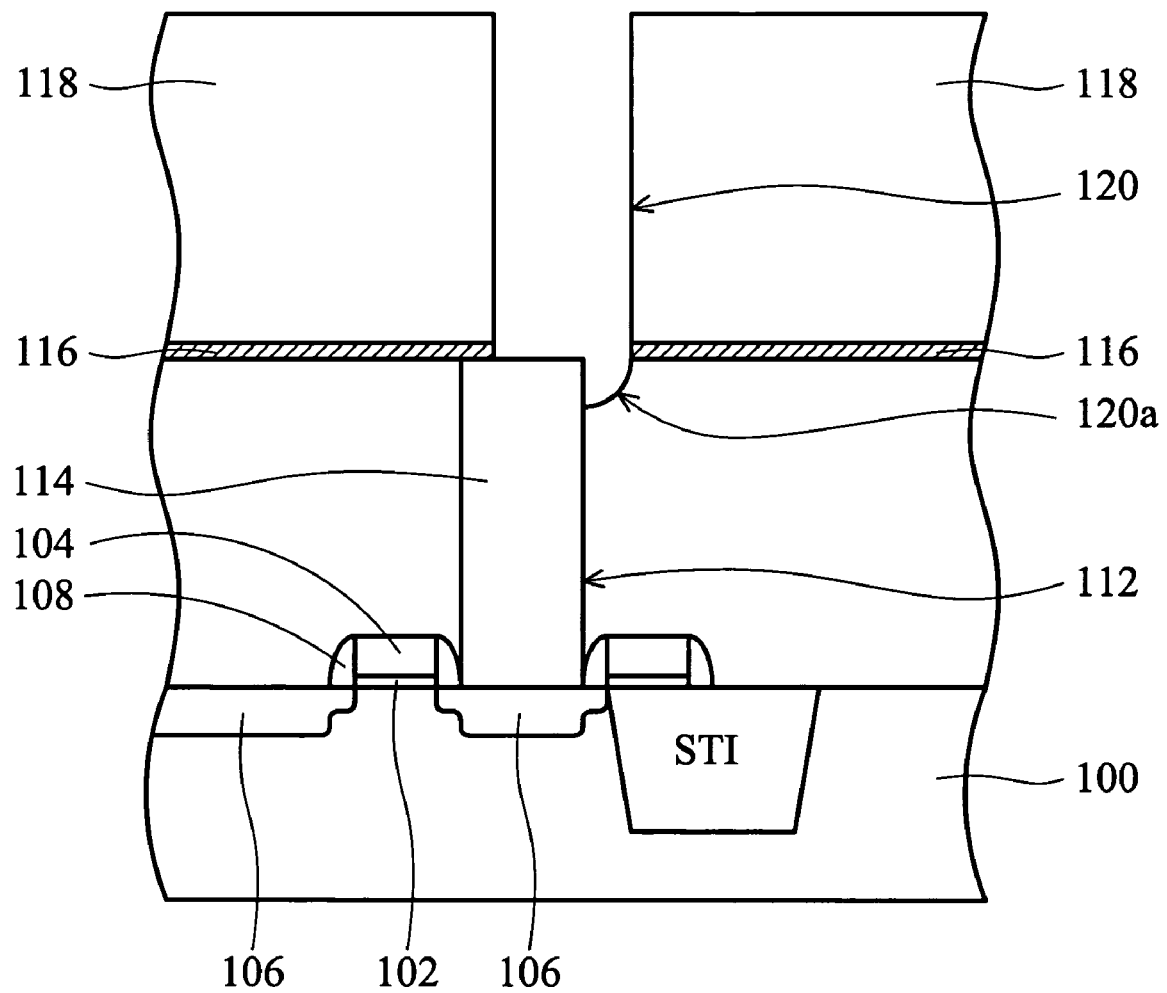

Referring to FIG. 4, a capacitor opening 120 is etched through the second insulating layer 118 and the stop layer 116 with an overlay shift to the contact plug 114. The capacitor opening 120 includes a trench portion 120a under the stop layer 116, which is formed during over-etching as explained earlier. The trench 120a exposes a sidewall portion of the contact plug 114.

Figure 5:
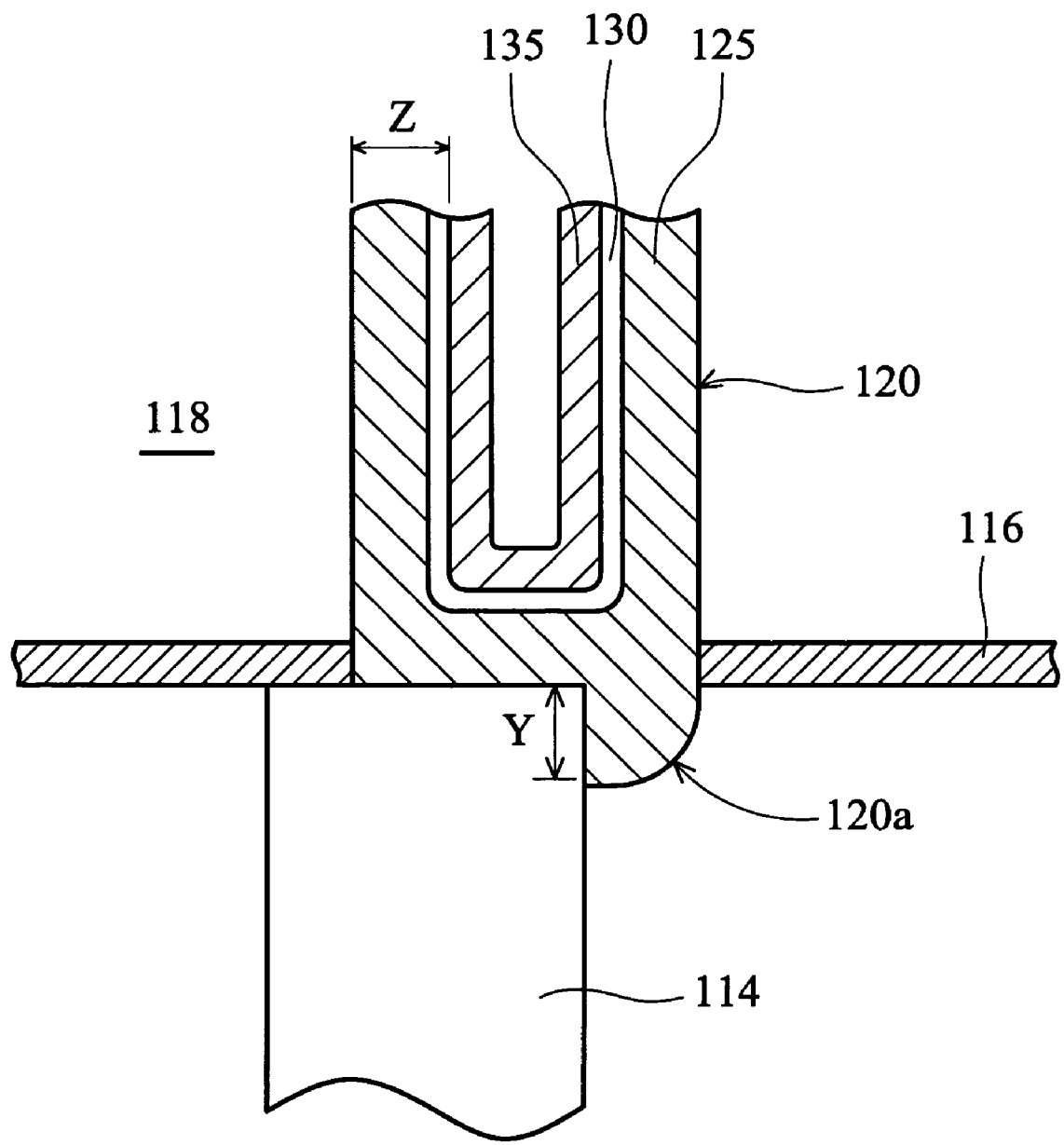

Next, a bottom electrode, a capacitor dielectric, and a top electrode are conformally deposited in the capacitor opening 120 to complete a cup-shaped capacitor. FIG. 5 is a partially enlarged cross-section showing a cup-shaped capacitor formed in the capacitor opening 120 of FIG. 4. As shown in FIG. 5, a key feature of the invention is a bottom electrode 125 sufficient to fill the trench portion 120a to avoid formation of the sharp tip in FIG. 2. Specifically, the bottom electrode 125 and the capacitor dielectric 130 are deposited to a thickness Z not less than the sidewall height exposed by the trench 120a, or alternatively, the trench depth Y ($Z \geq Y$). After the trench portion 120a is fully filled by the bottom electrode 125 and the capacitor dielectric 130, the top electrode 135 can be deposited with no sharp tip formed at its bottom corner.

Figure 6:
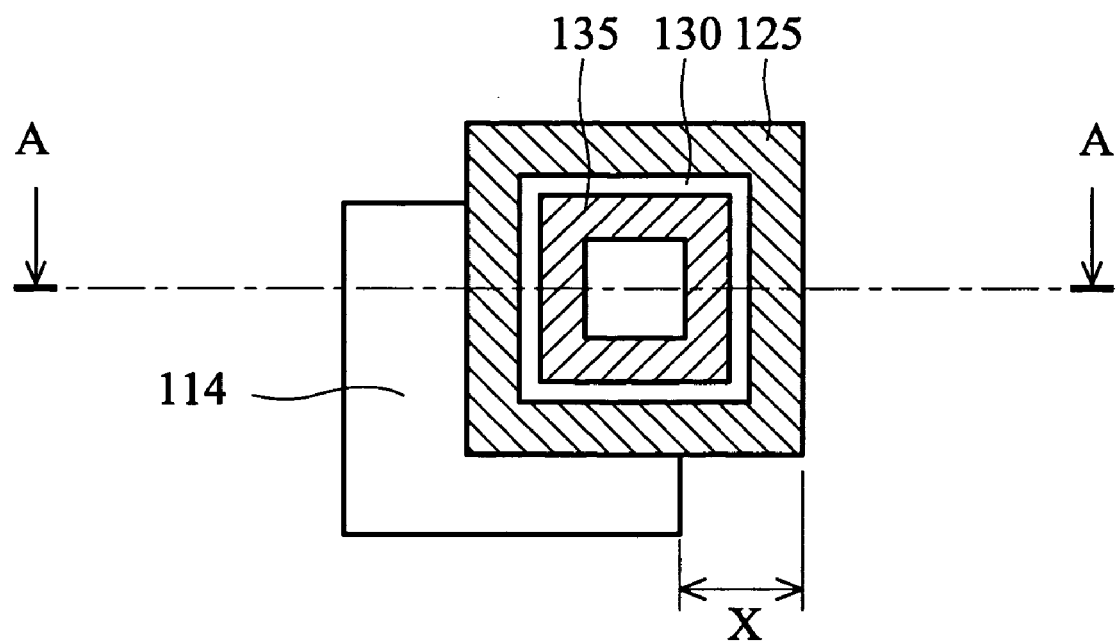

A top view of the structure is shown in FIG. 6. The region A-A in FIG. 6 is the cross-section shown in FIG. 5. The top view of FIG. 6 shows the capacitor aligned over the contact plug 114 with an overlay shift distance X.

Figure 7:
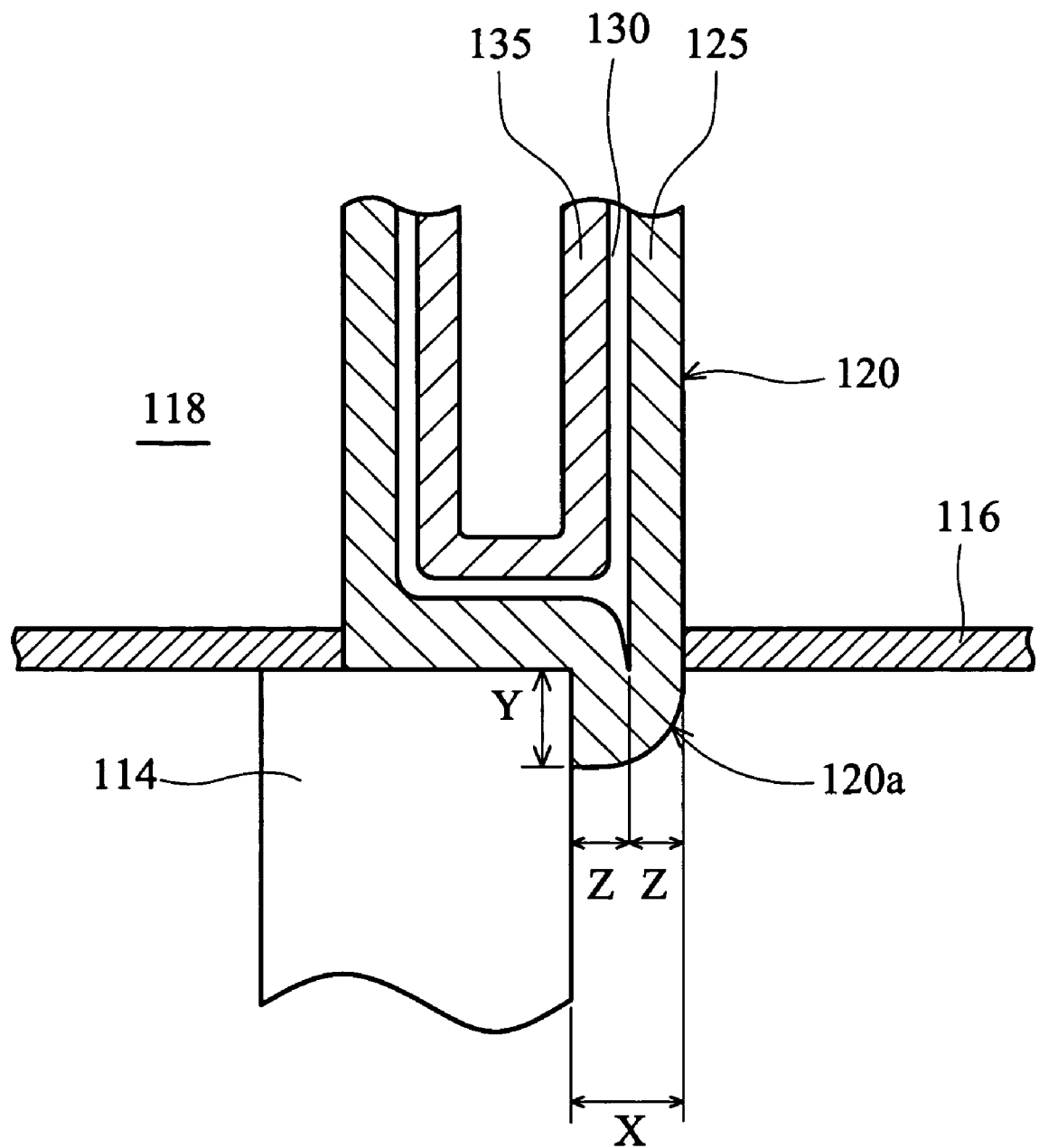

FIG. 7 is a partially enlarged cross-section showing another approach for filling the trench 120a when thickness Z is less than the trench depth Y ($Z<Y$). As shown, in this approach, the trench 120a is also fully filled by the bottom electrode 125 and the capacitor dielectric 130 provided twice the thickness Z is not less than the overlay shift distance X ($2Z \geq X$).

Accordingly, the formation of a sharp tip on the bottom corner of the top electrode 135 can be avoided when at least one of the conditions is satisfied:

$Z \geq Y$ or $Z \geq \frac{1}{2}X$ where X is the width of the trench 120a (or the distance of the overlay shift), Y is the depth of the trench 120a (or the sidewall height of the contact plug 114 covered by the bottom electrode 125), and Z is the total thickness of the bottom electrode 125 and the capacitor dielectric 130. Hence, once the dimensions (X,Y) of the trench are determined by inspection tool such as scanning electron microscope (SEM), the thickness Z required for filling the trench can be adjusted to avoid sharp tip formation, improving process reliability.

The materials for the top and bottom electrodes 125, 135 are not specifically limited in the invention, but are preferably TaN, TiN, Ta, Ti, TaSiN, TiW, NiCr, MoN, Ru, WN, WSiN, or combinations thereof. Note that the materials for the top and bottom electrodes 125, 135 may be the same or different. The capacitor dielectric 130 may be ONO, $Ta_2O_5$, $Al_2O_3$, lead zirconate titanate (PZT), barium strontium titanate (BST), $HfO_2$, or any other ferroelectric material.

Figure 8:
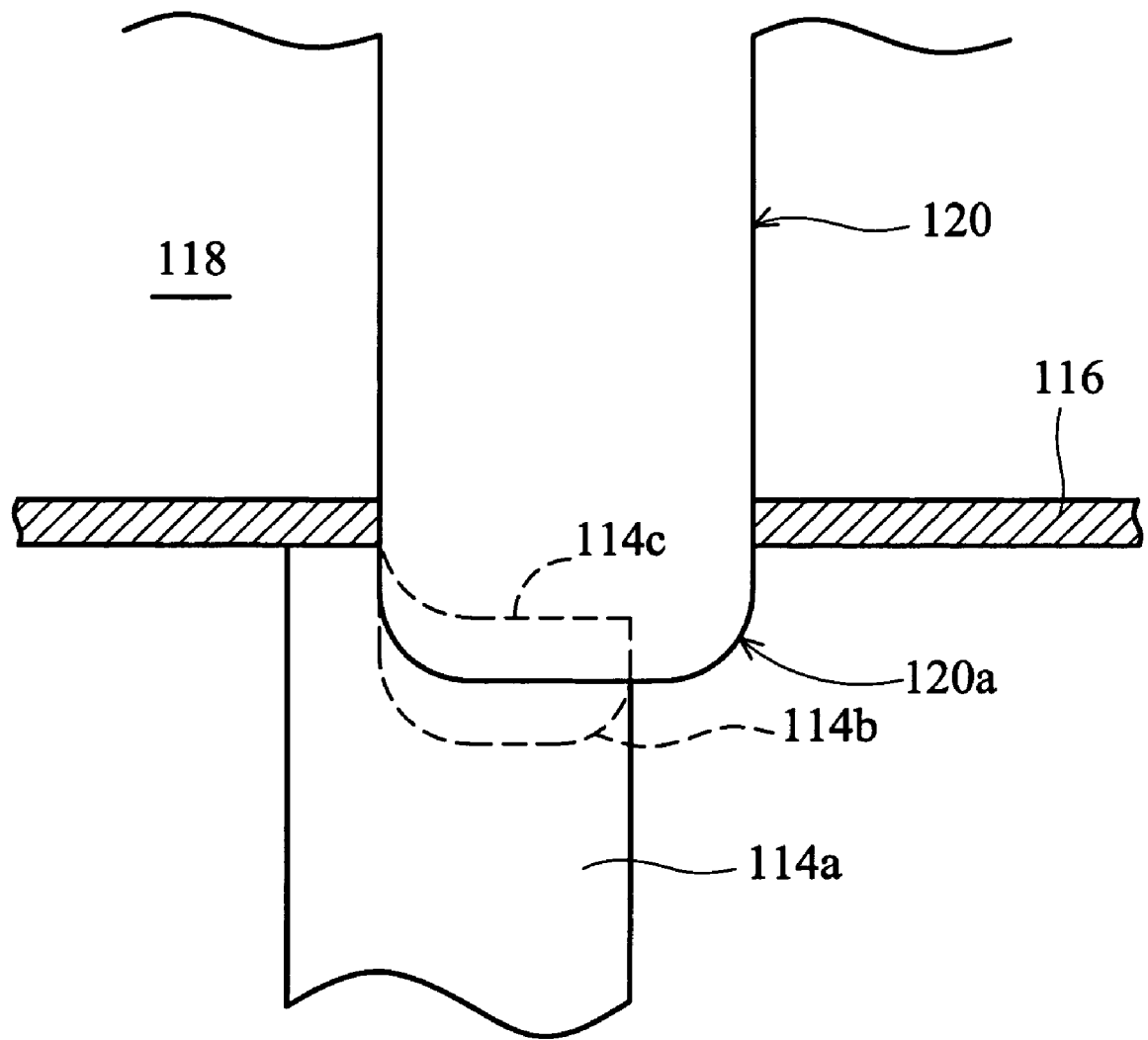
FIGS. 8 to 9 are cross-sections showing a second embodiment of the invention for preventing capacitor leakage.
Figure 9:
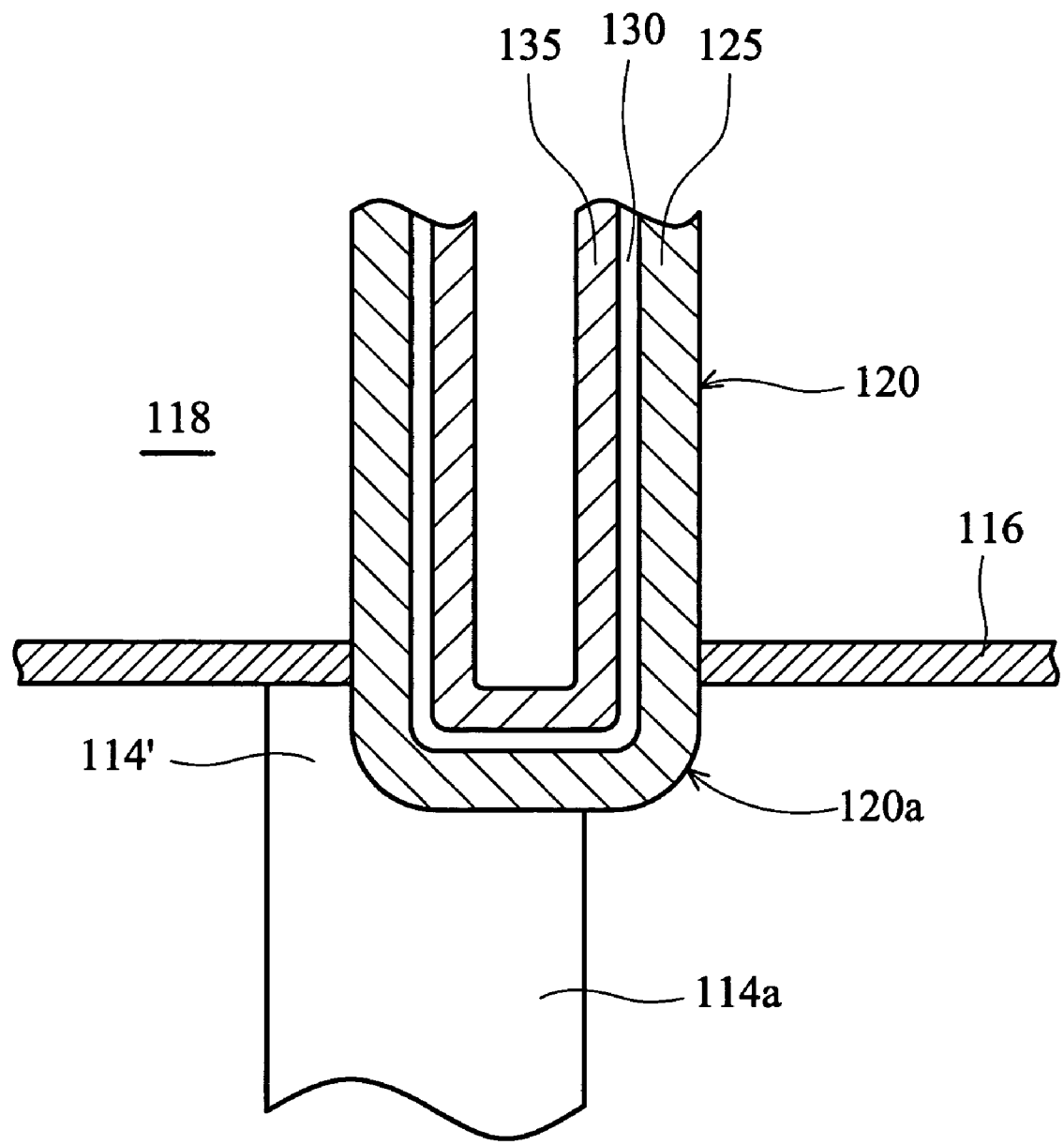

FIGS. 8-9 illustrate a second embodiment of the invention. In this embodiment, sharp tip formation is avoided by eliminating the unwanted trench portion 120a. FIG. 8 shows another key feature of the invention. Continuing with the steps illustrated in FIG. 4, the contact plug 114 is recessed before the deposition of a storage capacitor.

As shown in FIG. 8, the exposed portion of the contact plug is partially etched back by plasma etching to recess portions adjacent to and exposed by the trench 120a. Most preferably, the recessed contact plug 114 is about the same depth as the trench 120a such that the trench 120a is substantially eliminated. Alternatively, the contact plug can be recessed below the trench portion, as illustrated by broken-line profile 114b, but still provides a continuous smooth surface for subsequent depositions without formation of sharp tip. Although less preferable, the contact plug may be recessed with a remaining sidewall portion above the trench 120a, as illustrated by broken-line profile 114c, as long as a substantial portion of the plug sidewall is etched away. In this case, the trench portion 120a remains, but in a reduced size, and can therefore be easily filled by the subsequent deposition of bottom electrode without causing problems.

Referring to FIG. 9, after the trench portion 120a is eliminated or substantially reduced, the bottom electrode 125, capacitor dielectric 130, and top electrode 135 are then deposited over the recessed contact plug 114a. As shown, the semiconductor device of the second embodiment includes a contact plug 114a having a top flange 114', and a capacitor landing on the contact plug 114a with an overlay shift with the top flange 114' of the contact plug fitting against the bottom sidewall of the capacitor.

While the foregoing discussion has been presented within the context of a cup-shaped capacitor formed to avoid capacitor dielectric leakage caused by the sharp tip formation, the invention is not limited thereto. As will be appreciated by persons skilled in the art, the improved reliability and other benefits of the invention will be realized through other capacitor shapes as well. Particularly in the second embodiment, in which the trench is substantially eliminated, the structure of the capacitor may differ from those shown in FIG. 9 while still avoiding formation of sharp tip.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a contact plug formed in a contact opening through a first insulating layer;
an etch stop layer on the first insulating layer;
a second insulating layer directly on the etch stop layer;
a capacitor landing on the contact plug with an overlay shift, comprising a bottom electrode on the top and sidewall of the contact plug, a capacitor dielectric on the bottom electrode, and a top electrode on the capacitor dielectric;
wherein the second insulating layer defines the height of the capacitor bottom electrode;
wherein one corner of the top surface of the contact plug is covered by the capacitor;
wherein the etch stop layer extends to other three corners of the contact plug not covered by the capacitor; and
wherein the total thickness Z of the bottom electrode and the capacitor dielectric satisfies at least one of the conditions:

$$Z \geq Y \text{ or } Z \geq \tfrac{1}{2}X$$

where X is the distance of the overlay shift, and Y is the height of the sidewall of the contact plug covered by the bottom electrode.

2. The semiconductor device of claim 1, wherein the contact plug is formed over a source/drain region of a MOSFET transistor.

3. The semiconductor device of claim 1, wherein the capacitor is a cup-shaped capacitor.

4. The semiconductor device of claim 1, wherein the etch stop layer is a single-layered etch stop layer.

* * * * *